United States Patent
Werkhoven

(10) Patent No.: US 8,785,316 B2
(45) Date of Patent: Jul. 22, 2014

(54) METHODS FOR FORMING SEMICONDUCTOR MATERIALS BY ATOMIC LAYER DEPOSITION USING HALIDE PRECURSORS

(71) Applicant: Soitec, Crolles Cedex (FR)

(72) Inventor: Christiaan J. Werkhoven, Gilbert, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/933,855

(22) Filed: Jul. 2, 2013

(65) Prior Publication Data

US 2013/0295708 A1    Nov. 7, 2013

Related U.S. Application Data

(60) Continuation of application No. 13/357,805, filed on Jan. 25, 2012, now Pat. No. 8,486,193, which is a division of application No. 12/895,311, filed on Sep. 30, 2010, now Pat. No. 8,133,806.

(51) Int. Cl.
    *H01L 21/28*     (2006.01)

(52) U.S. Cl.
    USPC ............. 438/602; 438/604; 438/606; 117/95; 117/98

(58) Field of Classification Search
    USPC ........................ 438/602, 604, 606; 117/95, 98
    See application file for complete search history.

(56) References Cited

U.S. PATENT DOCUMENTS

| | | |
|---|---|---|
| 3,146,137 A | 8/1964 | Williams et al. |
| 3,679,949 A | 7/1972 | Uekusa et al. |
| 4,016,589 A | 4/1977 | Tanimura et al. |
| 4,792,467 A | 12/1988 | Melas |
| 4,839,145 A | 6/1989 | Gale et al. |
| 5,035,767 A | 7/1991 | Nishizawa |
| 5,077,875 A | 1/1992 | Hoke et al. |
| 5,146,869 A | 9/1992 | Bohannon et al. |

(Continued)

FOREIGN PATENT DOCUMENTS

| | | |
|---|---|---|
| JP | 59188118 A | 10/1984 |
| JP | 63045199 A | 2/1988 |

(Continued)

OTHER PUBLICATIONS

French Search Report for French Application No. 1058774 dated Jun. 14, 2011, 2 pages.

(Continued)

*Primary Examiner* — Hsien Ming Lee
(74) *Attorney, Agent, or Firm* — TraskBritt

(57) ABSTRACT

Methods of depositing a III-V semiconductor material on a substrate include sequentially introducing a gaseous precursor of a group III element and a gaseous precursor of a group V element to the substrate by altering spatial positioning of the substrate with respect to a plurality of gas columns. For example, the substrate may be moved relative to a plurality of substantially aligned gas columns, each disposing a different precursor. Thermalizing gas injectors for generating the precursors may include an inlet, a thermalizing conduit, a liquid container configured to hold a liquid reagent therein, and an outlet. Deposition systems for forming one or more III-V semiconductor materials on a surface of the substrate may include one or more such thermalizing gas injectors configured to direct the precursor to the substrate via the plurality of gas columns.

18 Claims, 7 Drawing Sheets

(56) References Cited

U.S. PATENT DOCUMENTS

| | | | |
|---|---|---|---|
| 5,250,148 | A | 10/1993 | Nishizawa et al. |
| 5,589,110 | A | 12/1996 | Motoda et al. |
| 5,730,802 | A | 3/1998 | Ishizumi et al. |
| 5,782,980 | A | 7/1998 | Allen et al. |
| 6,080,241 | A | 6/2000 | Li et al. |
| 6,090,705 | A | 7/2000 | Arena et al. |
| 6,110,809 | A | 8/2000 | Sze et al. |
| 6,121,140 | A | 9/2000 | Arena et al. |
| 6,126,719 | A | 10/2000 | Sturgill et al. |
| 6,153,010 | A | 11/2000 | Kiyoku et al. |
| 6,153,012 | A | 11/2000 | Rupp et al. |
| 6,179,913 | B1 | 1/2001 | Solomon et al. |
| 6,206,971 | B1 | 3/2001 | Umotoy et al. |
| 6,207,844 | B1 | 3/2001 | Kouvetakis et al. |
| 6,355,107 | B1 | 3/2002 | Solomon et al. |
| 6,440,494 | B1 | 8/2002 | Arena-Foster |
| 6,495,707 | B1 | 12/2002 | Leese et al. |
| 6,569,765 | B1 | 5/2003 | Solomon et al. |
| 6,632,725 | B2 | 10/2003 | Trassoudaine et al. |
| 6,689,252 | B1 | 2/2004 | Shamouilian et al. |
| 6,733,591 | B2 | 5/2004 | Anderson |
| 6,815,362 | B1 | 11/2004 | Wong et al. |
| 6,911,083 | B2 | 6/2005 | Hara |
| 6,921,062 | B2 | 7/2005 | Gregg et al. |
| 7,011,711 | B2 | 3/2006 | Shreter et al. |
| 7,118,781 | B1 | 10/2006 | Sumakeris et al. |
| 7,128,785 | B2 | 10/2006 | Kaeppeler et al. |
| 7,279,047 | B2 | 10/2007 | Melnik et al. |
| 7,413,982 | B2 | 8/2008 | Levy |
| 7,456,429 | B2 | 11/2008 | Levy |
| 7,501,023 | B2 | 3/2009 | Dmitriev et al. |
| 7,572,686 | B2 | 8/2009 | Levy et al. |
| 7,608,526 | B2 | 10/2009 | Cody et al. |
| 7,670,435 | B2 | 3/2010 | Tsvetkov et al. |
| 8,133,806 | B1 | 3/2012 | Werkhoven |
| 2002/0100418 | A1 | 8/2002 | Sandhu |
| 2003/0024475 | A1 | 2/2003 | Anderson |
| 2003/0221617 | A1 | 12/2003 | Lim |
| 2004/0025370 | A1 | 2/2004 | Guenther |
| 2005/0221021 | A1 | 10/2005 | Strang |
| 2005/0242061 | A1 | 11/2005 | Fukuda |
| 2005/0258459 | A1 | 11/2005 | Hwang et al. |
| 2006/0008941 | A1 | 1/2006 | Haskell et al. |
| 2006/0011135 | A1 | 1/2006 | Dmitriev et al. |
| 2006/0040475 | A1 | 2/2006 | Emerson |
| 2006/0042544 | A1 | 3/2006 | Hasebe et al. |
| 2006/0115595 | A1 | 6/2006 | Shenai-Khatkhate et al. |
| 2006/0226117 | A1 | 10/2006 | Bertram et al. |
| 2006/0228473 | A1 | 10/2006 | Satoh |
| 2006/0275546 | A1 | 12/2006 | Arena et al. |
| 2007/0014990 | A1 | 1/2007 | Arico et al. |
| 2007/0190780 | A1* | 8/2007 | Chung et al. ............... 438/675 |
| 2007/0238311 | A1 | 10/2007 | Levy |
| 2008/0166880 | A1 | 7/2008 | Levy |
| 2008/0166884 | A1 | 7/2008 | Nelson et al. |
| 2008/0248200 | A1 | 10/2008 | Arena et al. |
| 2009/0081366 | A1 | 3/2009 | Kerr et al. |
| 2009/0081842 | A1 | 3/2009 | Nelson et al. |
| 2009/0081885 | A1 | 3/2009 | Levy et al. |
| 2009/0081886 | A1 | 3/2009 | Levy et al. |
| 2009/0130858 | A1 | 5/2009 | Levy |
| 2009/0178611 | A1 | 7/2009 | Arena et al. |
| 2009/0205563 | A1 | 8/2009 | Arena et al. |
| 2009/0214785 | A1 | 8/2009 | Arena et al. |
| 2009/0217878 | A1 | 9/2009 | Levy et al. |
| 2009/0223441 | A1 | 9/2009 | Arena et al. |
| 2009/0223442 | A1 | 9/2009 | Arena et al. |
| 2009/0223453 | A1 | 9/2009 | Arena et al. |
| 2009/0283029 | A1 | 11/2009 | Arena et al. |
| 2010/0000681 | A1 | 1/2010 | Bertram et al. |
| 2010/0041213 | A1 | 2/2010 | Lee |
| 2010/0258053 | A1 | 10/2010 | Arena et al. |
| 2010/0297846 | A1* | 11/2010 | Kaga et al. ............... 438/680 |
| 2012/0083100 | A1 | 4/2012 | Bertram, Jr. |
| 2012/0118233 | A1 | 5/2012 | Werkhoven |
| 2013/0047918 | A1 | 2/2013 | Bertram, Jr. et al. |

FOREIGN PATENT DOCUMENTS

| | | | |
|---|---|---|---|
| JP | 63316425 | A | 12/1988 |
| JP | 04132681 | A | 5/1992 |
| JP | 07321045 | A | 12/1995 |
| JP | 09293681 | A | 11/1997 |
| JP | 2005259854 | A | 9/2005 |
| JP | 2008066490 | A | 3/2008 |
| WO | 0068471 | A1 | 11/2000 |
| WO | 2010024671 | A1 | 3/2010 |
| WO | 2010101715 | A1 | 9/2010 |

OTHER PUBLICATIONS

French Written Opinion for French Application No. 1058774 dated Oct. 26, 2010, 5 pages.

International Search Report and Written Opinion for International Application No. PCT/US2007/084820 mailed Apr. 9, 2008, 10 pages.

International Search Report and Written Opinion for International Application No. PCT/US2007/070721 mailed Feb. 1, 2008, 14 pages.

International Search Report and Written Opinion for International Application No. PCT/US2007/084845 dated May 22, 2008, 11 pages.

International Search Report and Written Opinion for International Application No. PCT/US2007/084826 mailed Mar. 31, 2008, 7 pages.

International Search Report and Written Opinion for International Application No. PCT/US2007/084935 mailed May 7, 2008, 9 pages.

Kim et al., Atomic Layer Deposition of GaN Using GaCl3 and NH3, J. Vac. Sci. Technol., Jul./Aug. 2009, vol. A 27, No. 4, pp. 923-928.

Lee et al., Vapor Phase Epitaxy of GaN Using AgCl3/N2 and NH3/N2, Journal of Crystal Growth (1996), vol. 169, pp. 689-696.

Levy et al., Oxide Electronics by Spatial Atomic Layer Deposition, Journal of Display Technology, Dec. 2009, vol. 5, No. 12, pp. 484-494.

Standard Search Report, European Patent Office, dated Jan. 31, 2007.

Varadarajan et al., On the Chloride Vapor-Phase Epitaxy Growth of GaN and its Characterization, Journal of Crystal Growth (2004), vol. 260, pp. 43-49.

* cited by examiner

METHODS FOR FORMING SEMICONDUCTOR MATERIALS BY ATOMIC LAYER DEPOSITION USING HALIDE PRECURSORS

CROSS-REFERENCE TO RELATED APPLICATIONS

This application is a continuation of U.S. patent application Ser. No. 13/357,805, filed Jan. 25, 2012, now U.S. Pat. No. 8,486,193, issued Jul. 16, 2013, which application is a divisional of U.S. patent application Ser. No. 12/895,311, filed Sep. 30, 2010, now U.S. Pat. No. 8,133,806, issued Mar. 13, 2012, the disclosure of each of which is incorporated herein in its entirety by this reference. The subject matter of this application is related to the subject matter of U.S. Patent Provisional Application Ser. No. 61/157,112, which was filed on Mar. 3, 2009 in the name of Arena et al., and to the subject matter of U.S. patent application Ser. No. 12/894,724, filed Sep. 30, 2010, now U.S. Pat. No. 8,486,192, issued Jul. 16, 2013, the entire disclosure of each of which is incorporated herein in its entirety by this reference.

FIELD

Embodiments of the invention generally relate to systems for depositing materials on substrates, and to methods of making and using such systems. More particularly, embodiments of the invention relate to atomic layer deposition (ALD) methods for depositing III-V semiconductor materials on substrates and to methods of making and using such systems.

BACKGROUND

III-V semiconductor materials are rapidly developing for use in electronic and optoelectronic applications. Many III-V semiconductor materials have direct band gaps, which make them particularly useful for fabricating optoelectronic devices, such as light-emitting diodes (LEDs) and laser diodes (LDs). Specific III-V semiconductor materials, such as gallium nitride (GaN), indium nitride (InN), aluminum nitride (AlN) and their alloys (commonly referred to as the III-nitrides), are emerging as important materials for the production of shorter wavelength LEDs and LDs, including blue and ultra-violet light-emitting optoelectronic devices. Wide band gap III-nitrides may also be utilized for high-frequency and high-power electronic devices due to the III-nitrides' ability to operate at high current levels, high breakdown voltages and high temperatures.

One widely used process for depositing III-V semiconductor materials is referred to in the art as metal-organic chemical vapor deposition (MOCVD). In MOCVD processes, a substrate is exposed to one or more gaseous precursors in a reaction chamber, which react, decompose, or both react and decompose in a manner that results in the epitaxial deposition of the group III-V material on a surface of the substrate. MOCVD processes are often used to deposit III-V semiconductor materials by introducing both a precursor containing a group III element (i.e., a group III element precursor) and a precursor containing a group V element (i.e., a group V element precursor) into the reaction chamber containing the substrate. This results in mixing of the precursors (i.e., the group III element precursor and the group V element precursor) before their exposure to the surface of the substrate.

Deposition of III-V semiconductor materials using a MOCVD process involves a balance between growth rate at the surface of the substrate and compound formation in the vapor phase. Specifically, mixing of the group III element precursor and the group V element precursor may result in the formation of particles that consume the precursors that are otherwise used to form the III-V semiconductor material on a suitable growth substrate. Consumption of available precursors during the MOCVD process creates difficulties in controlling the growth rate, thickness and composition of the III-V semiconductor material, especially in large reaction chambers. Variation in the thickness and composition of the III-V semiconductor material formed using the MOCVD processes may negatively affect throughput and yield of devices having a specific emission wavelength, such as wavelength-specific LEDs. Furthermore, deposition rates of III-V semiconductor materials formed by MOCVD processes are generally low, thus decreasing throughput and increasing cost per wafer.

Atomic layer deposition (ALD) is a process used to deposit conformal material with atomic scale thickness control. ALD may be used to deposit III-V semiconductor materials. ALD is a multi-step, self-limiting process that includes the use of at least two reagents or precursors. Generally, a first precursor is introduced into a reactor containing a substrate and adsorbed onto a surface of the substrate. Excess precursor may be removed by pumping and purging the reactor using, for example, a purge gas. A second precursor is then introduced into the reactor and reacted with the adsorbed material to form a conformal layer or film of a material on the substrate. Under select growth conditions the deposition reaction may be self-limiting in that the reaction terminates once the initially adsorbed material reacts fully with the second precursor. Excess precursor is again removed by pumping and purging the reactor. The process may be repeated to form another layer of the material, with the number of cycles determining the total thickness of the deposited film.

III-V semiconductor materials formed utilizing ALD processes may be of a higher crystalline quality than those formed by conventional MOCVD processes. ALD processes may allow for greater control of precursor incorporation into the deposited crystalline material and consequently a greater control of the composition of the crystalline material formed, e.g., of the III-V semiconductor material formed by such ALD processes. Such stringent control of the composition of the III-V semiconductor material may be of consequence in light-emitting devices, for example, to ensure a uniform emission wavelength between light-emitting devices fabricated on a single growth substrate and between light-emitting devices from growth substrate to growth substrate.

However, the growth rate of III-V semiconductor materials by conventional ALD processes is relatively low in comparison to that of MOCVD. Furthermore, high throughput of III-V semiconductor materials by conventional ALD requires increased load sizes that make purging excess precursor and purge gas out of the reactor difficult. Thus, currently available ALD reactors are often configured for single wafer processing, leading to low throughput and high cost per wafer of III-V semiconductor materials by ALD.

Recently, ALD methods and systems have been developed in which each precursor is provided continuously in spatially separated regions, and each precursor is introduced to the substrate as the substrate is moved through each precursor in succession. Such processes are often referred to in the art as "spatial ALD" or "S-ALD."

BRIEF SUMMARY

This summary is provided to introduce a selection of concepts in a simplified form, such concepts being further described in the detailed description below of some example embodiments of the invention. This summary is not intended to identify key features or essential features of the claimed subject matter, nor is it intended to be used to limit the scope of the claimed subject matter.

In some embodiments, the present invention includes method of depositing material, such as a III-V semiconductor material, on a substrate. A group III element precursor and a group V element precursor may be introduced into alternating gas injectors of a plurality of substantially aligned gas injectors. A substrate may be moved relative to the plurality of substantially aligned gas injectors such that a surface of the substrate is exposed to the group III element precursor and the group V element precursor forming at least one III-V semiconductor material on the surface of the substrate.

In additional embodiments, the present invention includes deposition systems for forming semiconductor materials. The deposition systems may include a manifold including a plurality of substantially aligned gas injectors and at least one assembly for moving a substrate along a length of the manifold. At least one of the plurality of substantially aligned gas injectors includes an inlet, a thermalizing conduit, a liquid container configured to hold a liquid reagent therein, and an outlet. A pathway extends from the inlet, through the thermalizing conduit to an interior space within the liquid container, and from the interior space within the liquid container to the outlet.

BRIEF DESCRIPTION OF THE DRAWINGS

The present invention may be understood more fully by reference to the following detailed description of example embodiments of the present invention, which are illustrated in the appended figures in which.

DETAILED DESCRIPTION OF EMBODIMENTS OF THE INVENTION

Figure 1:
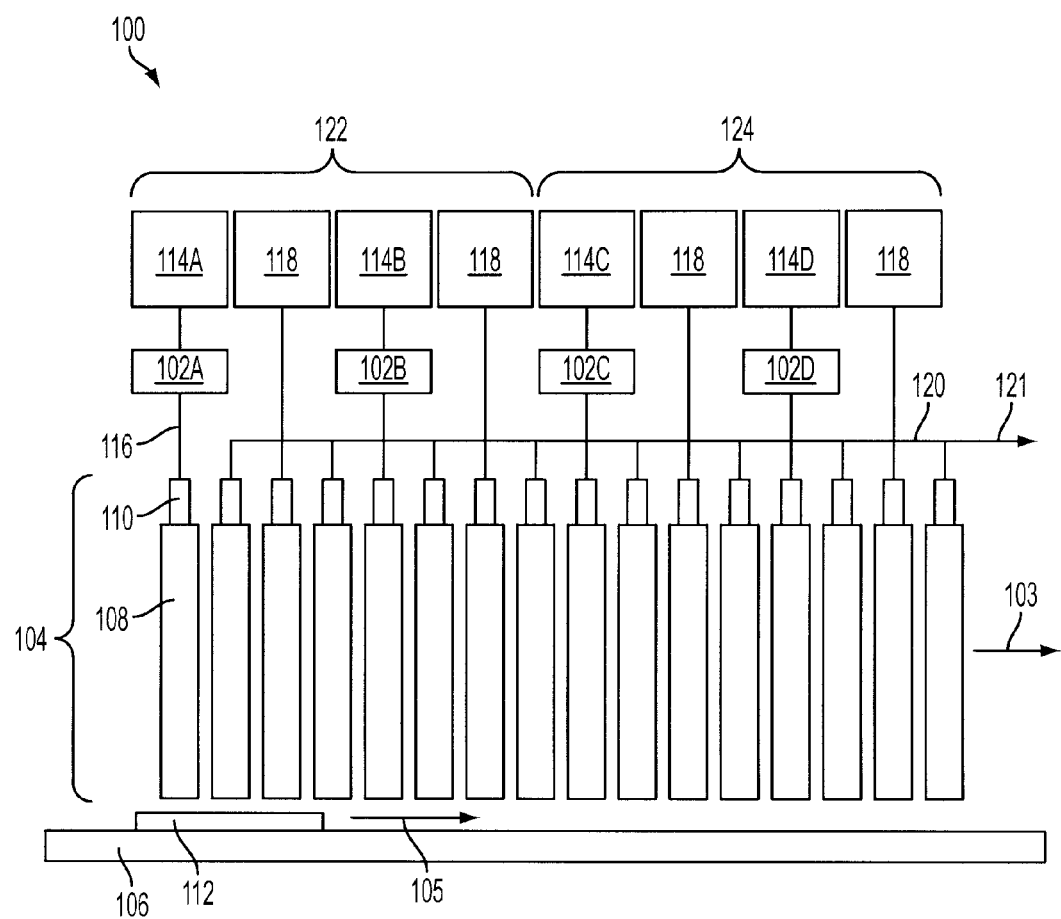
FIG. 1 is a cross-sectional view schematically illustrating an example embodiment of a deposition system of the invention that includes a manifold including at least one gas injector as described herein.

The illustrations presented herein are not meant to be actual views of any particular component, device, or system, but are merely idealized representations that are employed to describe embodiments of the present invention.

A number of references are cited herein, and the disclosures of which are incorporated herein, in their entireties, by this reference for all purposes. Further, none of the cited references, regardless of how characterized herein, are admitted as prior art relative to the invention of the subject matter claimed herein.

As used herein, the term "III-V semiconductor material" means and includes any semiconductor material that is at least predominantly comprised of one or more elements from group IIIA of the periodic table (B, Al, Ga, and In) and one or more elements from group VA of the periodic table (N, P, As and Sb). For example, III-V semiconductor materials include, but are not limited to, gallium nitride, gallium phosphide, gallium arsenide, indium nitride, indium phosphide, indium arsenide, aluminum nitride, aluminum phosphide, aluminum arsenide, indium gallium nitride, indium gallium phosphide, indium gallium arsenide, aluminum gallium nitride, aluminum gallium phosphide, aluminum gallium arsenide, indium gallium nitride phosphide, etc.

As used herein, the term "gas" includes gases (fluids that have neither independent shape nor volume) and vapors (gases that include diffused liquid or solid matter suspended therein), and the terms "gas" and "vapor" are used synonymously herein.

As used herein, the term "ALD growth cycle" means and includes exposing a surface of a substrate to a first precursor, chemisorption of the first precursor onto the surface of the substrate, exposing the surface of the substrate to a second precursor, and a surface reaction to form a layer of material.

Methods and systems that utilize an external source of one or more metal halides, such as, for example, gallium trichloride ($GaCl_3$), indium trichloride ($InCl_3$), and/or aluminum trichloride ($AlCl_3$) as precursors have recently been developed. Examples of such methods and systems are disclosed in U.S. Patent Application Publication No. US 2009/0223442 A1, which published Sep. 10, 2009 in the name of Arena et al., the entire disclosure of which application is incorporated herein in its entirety by this reference. Further, improved gas injectors have also been recently developed for use in such methods and systems. Examples of such gas injectors are disclosed in, for example, U.S. Provisional Patent Application Ser. No. 61/157,112, which was filed on Mar. 3, 2009 in the name of Arena et al., and in U.S. patent application Ser. No. 12/894,724, which was filed Sep. 30, 2010 in the name of Ronald T. Bertran, Jr. and entitled "Thermalizing Gas Injectors for Generating Increased Precursor Gas, Material Deposition Systems Including Such Injectors, and Related Methods," the entire disclosure of each of which application is incorporated herein in its entirety by this reference.

The metal halides are classified as inorganic ALD precursors. The use of such inorganic metal halide precursors for ALD processes may be advantageous over, for example, organic precursors since they are generally smaller, more reactive, thermally stable and usually leave small amounts of ligand residues in the deposited crystalline material. Small ligands reduce the risk of steric hindrance and, as a result, reduce growth per cycle. High thermal stability enables deposition without thermal decomposition at higher temperatures.

Embodiments of the present invention include, and make use of, new gas injectors in an atomic layer deposition (ALD)

process, as described in further detail below. An example of an embodiment of a deposition system 100 of the invention that includes a plurality of gas injectors 102A, 102B, 102C, 102D, such as those described in U.S. Provisional Patent Application Ser. No. 61/157,112 or U.S. patent application Ser. No. 12/894,724 is described below with reference to FIG. 1. Each of the gas injectors 102A, 102B, 102C, 102D may be configured to convert a source gas to one or more precursors for use in the ALD process. The deposition system 100 may provide a series of ALD growth cycles, each growth cycle forming a layer of a III-V semiconductor material. The deposition system 100 may, thus, be employed in forming a plurality of layers of III-V semiconductor material, each having a desired composition and thickness, for use in device structure formation including, for example, light-emitting diodes (LEDs) and the like.

The deposition system 100 may further include a manifold 104 and an assembly 106, such as a track, a conveyor or a support. The manifold 104 may include a plurality of gas columns 108 configured to receive at least one gas through a port 110 therein. The gas columns 108 may be positioned in longitudinal alignment with one another to form the manifold 104. The gas columns 108 of the manifold 104 may be arranged in any suitable configuration, such as a linear, a folded or a serpentine configuration. In some embodiments, the manifold 104 is configured to move relative to one or more workpiece substrates 112 (e.g., one or more dies or wafers) on which it is desired to deposit or otherwise provide III-V semiconductor material, as indicated by directional arrow 103. In other embodiments, the assembly 106 is configured to move the workpiece substrate 112 relative to the gas columns 108 of the manifold 104, as indicated by directional arrow 105. For example, the workpiece substrates 112 may comprise dies or wafers. The gas columns 108 may, therefore, be positioned at a sufficient distance above the assembly 106 for the workpiece substrate 112 to be moved through a space between the gas columns 108 and the assembly 106.

In the following description of the deposition system 100 and, more particularly, the manifold 104 of the deposition system 100, the terms "longitudinal" and "transverse" are used to refer to the directions relative to the manifold 104 and the assembly 106 and as shown in FIG. 1, wherein the longitudinal direction is the horizontal direction from the perspective of FIG. 1, and the transverse direction is the vertical direction from the perspective of FIG. 1. The longitudinal directions are also referred to as directions extending "along a length of the manifold" or "along a length of the assembly."

In some embodiments, the deposition system 100 includes a gas flow system used to supply one or more gases into the manifold 104 and to remove gases out of the manifold 104. For example, the deposition system 100 may include gas sources 114A, 114B, 114C, 114D that supply the gases to respective gas injectors 102A, 102B, 102C, 102D.

For example, one or more of the gas sources 114A, 114B, 114C, 114D may comprise an external source of a group III element or a group V element that may be supplied to the gas injectors 102A, 102B, 102C, 102D. The group III element source may include at least one of a source of gallium (Ga), a source of indium (In) and a source of aluminum (Al). As a non-limiting example, the group III element source may comprise at least one of gallium trichloride ($GaCl_3$), indium trichloride ($InCl_3$) and aluminum trichloride ($AlCl_3$). The group III element source, comprising at least one of $GaCl_3$, $InCl_3$ or $AlCl_3$, may be in the faun of a dimer such as, for example, $Ga_2Cl_6$, $In_2Cl_6$ or $Al_2Cl_6$. The group V element source may include a source of nitrogen (N), a source of arsenic (As) and/or a source of phosphorus (P). By way of example and not limitation, the group V element source may comprise one or more of ammonia ($NH_3$), arsine ($AsH_3$) or phosphine ($PH_3$). In some embodiments, source gases may be supplied from the gas sources 114A, 114B, 114C, 114D to the gas injectors 102A, 102B, 102C, 102D using one or more carrier gases, such as hydrogen gas ($H_2$), helium gas (He), argon (Ar), etc. The source gas may therefore comprise one or more group III element sources as well as one or more carrier gases.

As the source gas is conveyed from the gas sources 114A, 114B, 114C, 114D through conduits 116, the source gas may be heated to a temperature sufficient to generate a precursor gas from the source gas. For example, the source gas may include $GaCl_3$ and $H_2$, which may be heated to a temperature sufficient for the gallium trichloride to dissociate in the presence of hydrogen into gallium chloride (GaCl) and a chlorinated species, such as hydrogen chloride gas (HCl) and/or chlorine gas ($Cl_2$).

The gas sources 114A, 114B, 114C, 114D may supply source gas to the gas injectors 102A, 102B, 102C, 102D. Each of the gas injectors 102A, 102B, 102C, 102D may be configured for generating one or more precursors and for introducing the precursors to the workpiece substrate 112. For example, the gas injectors 102A, 102B, 102C, 102D may be configured to supply precursor gases to the elongated gas columns 108, which may be configured to direct the precursor gases toward the major surface of the workpiece substrate 112 in a direction substantially perpendicular to the major surface of the workpiece substrate 112. Thus, an area on the assembly 106 underlying each of the gas columns 108 represents an injection point at which the workpiece substrate 112 is exposed to the precursor gases.

The gas injectors 102A, 102B, 102C, 102D may each operate independently and may be spaced from adjacent gas injectors 102A, 102B, 102C, 102D at a distance sufficient to prevent cross-contamination of gases released by adjacent injectors 102A, 102B, 102C, 102D. Each of the gas injectors 102A, 102B, 102C, 102D may be configured to provide a sufficient amount of gas to saturate a surface of the workpiece substrate 112 and deposit a layer of a material on the surface of the workpiece substrate 112. The manifold 104 of the deposition system 100 shown in FIG. 1 is depicted with four gas injectors 102A, 102B, 102C, 102D; however, any number of gas injectors may be used. For example, the number of gas injectors used to supply a precursor (e.g., a group III element precursor or a group IV element precursor) to the workpiece substrate 112 may be selected based on a desired thickness of the material (e.g., the III-V semiconductor material).

In embodiments where the group III element precursor is formed from a gas comprising $GaCl_3$, $InCl_3$, or $AlCl_3$, the group III element precursor may be formed from the gas using at least one of the gas injectors 102A, 102B, 102C, 102D, as will be described.

The deposition system 100 also includes features for maintaining separation of the precursor gases during deposition of the III-V semiconductor material. For example, the deposition system 100 may include at least one purge gas source 118 for supplying a purge gas to corresponding gas columns 108 and an exhaust line 120 for drawing excess precursor gases from the deposition system 100, as indicated by directional arrow 121. The purge gas source 118 may comprise a purge gas, such as argon (Ar), nitrogen ($N_2$), and helium (He). The purge gas source 118 may be used to deliver the purge gas to the workpiece substrate 112 via the gas columns 108. For example, the purge gas source 118 may supply the purge gas to at least one of the gas columns 108 disposed between two of the gas columns 108 used to supply the precursors to the workpiece substrate 112. The gas columns 108 may also be used to remove excess gases (i.e., the precursor gases and the purge gases) from a surface of the workpiece substrate 112. The excess gases may be passed through the gas columns 108 and into the exhaust line 120 for removal from the deposition system 100. For example, the excess gases may be removed through one of the gas columns 108 disposed between each of the gas columns 108 configured to supply the precursor gases and purge gas to the workpiece substrate 112.

The assembly 106 is configured to support the workpiece substrate 112 and, in some embodiments, to transport the workpiece substrate 112 in sequence under each successive gas column 108. Although a single workpiece substrate 112 is shown in FIG. 1, the assembly 106 may be configured to support any number of workpiece substrates 112 for processing. In some embodiments, the assembly 106 may transport the workpiece substrate 112 along a length of the manifold 104. The workpiece substrate 112 and the manifold 104 may be moved relative to one another at a speed that enables each of the precursor gases generated by the corresponding gas injector 102A, 102B, 102C, 102D to saturate the surface of the workpiece substrate 112. As the surface of the workpiece substrate 112 is exposed to each of the precursors, a layer of material may be deposited over the surface of the workpiece substrate 112.

As the workpiece substrate 112 is moved relative to the gas columns 108, a plurality of ALD growth cycles for forming a III-V semiconductor material over the surface of the workpiece substrate 112 may be completed.

As previously mentioned, one or more of the gas injectors 102A, 102B, 102C, 102D of the deposition system 100 may be or include one of the various embodiments of gas injectors described in detail with reference to FIGS. 2 through 7. In some embodiments, the gas injectors 102A, 102B, 102C, 102D may include a thermalizing gas injector as described in U.S. Patent Application Ser. No. 61/157,112, but further including a reservoir configured to hold a liquid reagent for reacting with a source gas (or a decomposition or reaction product of a source gas). For example, the reservoir may be configured to hold a liquid metal or other element, such as, for example, liquid gallium, liquid aluminum, or liquid indium In some embodiments, the reservoir may be configured to hold one or more solid materials, such as, for example, iron, silicon, or magnesium.

Figures 2, 3:
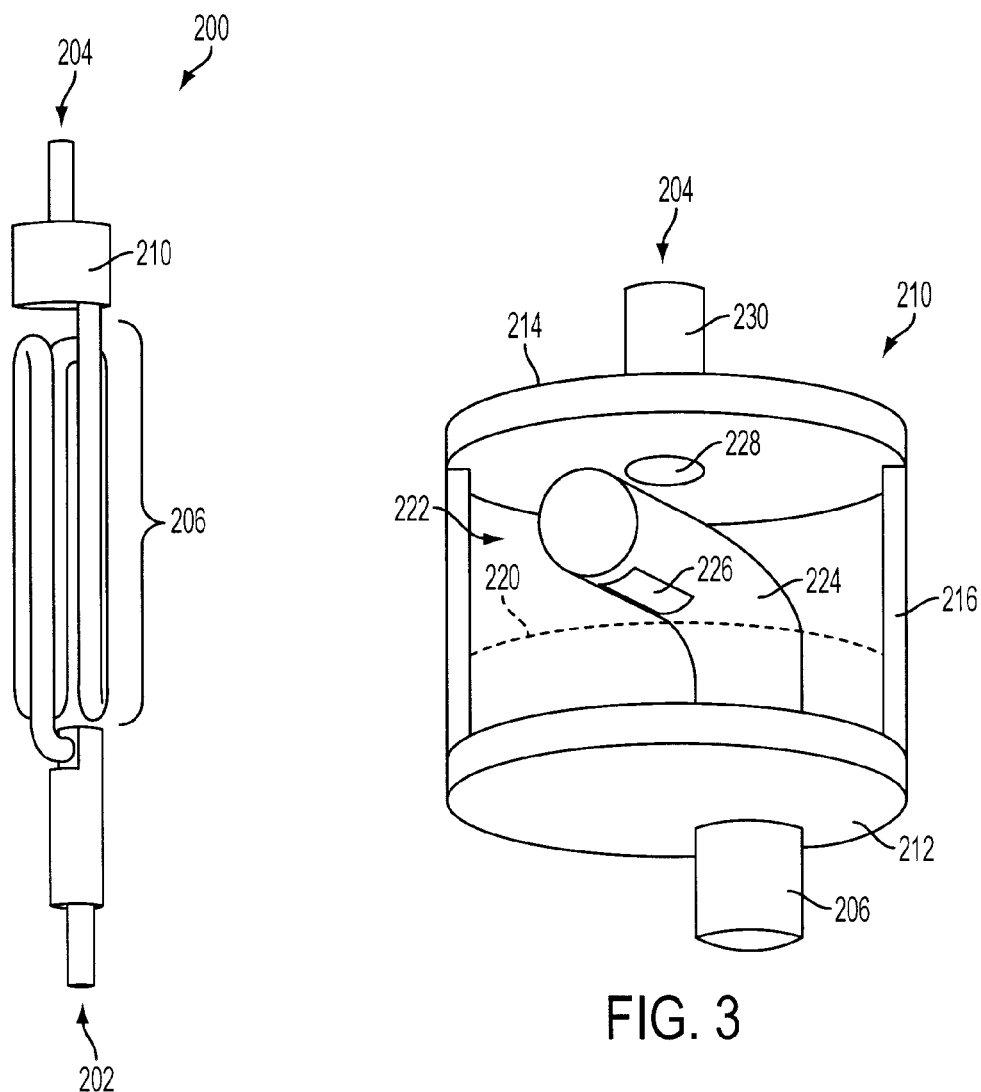
FIG. 2 schematically illustrates an example embodiment of a gas injector of the invention, one or more of which may be used in embodiments of deposition systems of the invention, such as the deposition system of FIG. 1.
FIG. 3 is an enlarged, partially cut-away view of a portion of the gas injector of FIG. 2.

FIG. 2 is a perspective view of an embodiment of a gas injector 200 of the invention. As shown in FIG. 2, the gas injector 200 includes an inlet 202, an outlet 204, a thermalizing conduit 206, and a container 210. The container 210 is configured to hold a liquid reagent therein. For example, a liquid metal such as liquid gallium, liquid indium, liquid aluminum, etc., may be disposed within the container 210. A source gas, comprising for example, $GaCl_3$ and $H_2$, may be supplied to the inlet 202. The source gas may flow from the inlet 202 into the thermalizing conduit 206. The thermalizing conduit 206 may be configured to heat the source gas flowing through the thermalizing conduit 206 for a desirable amount of time (i.e., a residence time), which may be a function of the cross-sectional area of the flow path within the thermalizing conduit 206, the flow rate of the source gas through the thermalizing conduit 206, and the overall length of the thermalizing conduit 206. The thermalizing conduit 206 may be shaped and configured to be located proximate to one or more active or passive heating elements, as discussed in further detail below.

Furthermore, the thermalizing conduit 206 may include one or more curved sections or turns, such that the length of the physical space occupied by the thermalizing conduit 206 is significantly less than the actual length of the flow path through the thermalizing conduit 206. Stated another way, a length of the thermalizing conduit 206 may be longer than a shortest distance between the inlet 202 and the liquid container 210. In some embodiments, the length of the thermalizing conduit 206 may be at least about twice the shortest distance between the inlet 202 and the liquid container 210, at least about three times the shortest distance between the inlet 202 and the liquid container 210, or even at least about four times the shortest distance between the inlet 202 and the liquid container 210. For example, the thermalizing conduit 206 may have a serpentine configuration, as shown in FIG. 2 that includes a plurality of generally parallel straight sections connected together in an end-to-end fashion by curved sections that extend through an angle of 180°.

The thermalizing conduit 206 may comprise a tube that is at least substantially comprised of a refractory material such as, for example, quartz.

In some embodiments, the source gas may at least partially decompose within the thermalizing conduit 206. For example, in embodiments in which the source gas comprises $GaCl_3$ and $H_2$, the $GaCl_3$ may decompose in the presence of $H_2$ into gaseous GaCl and a chlorinated gas species, such as, for example, hydrogen chloride gas (HCl) and/or chlorine gas ($Cl_2$).

The gases flow from the thermalizing conduit 206 into the container 210. FIG. 3 is an enlarged, partially cut-away view of the container 210. As shown in FIG. 3, the container 210 includes a bottom wall 212, a top wall 214, and at least one side wall 216. In the embodiment of FIGS. 2 and 3, the reservoir has a generally cylindrical shape, such that each of the bottom wall 212 and the top wall 214 has a circular shape and is at least substantially planar, and such that the side wall 216 is at least substantially cylindrical (e.g., tubular). The bottom wall 212, the top wall 214, and the at least one side wall 216 together define a hollow body, the interior of which defines a reservoir for holding a liquid reagent, such as liquid gallium.

The interior space within the hollow container 210 may be partially filled with a liquid reagent, such as liquid gallium, liquid indium and liquid aluminum. For example, the container 210 may be filled with the liquid reagent to the level indicated by the dashed line 220 in FIG. 3, such that a void or space 222 is present over the liquid reagent within the container 210. Gases flowing out from the thermalizing conduit 206 may be injected into the space 222 over the liquid reagent within the container 210. As a non-limiting example, the gases flowing out from the thermalizing conduit 206 may flow through the bottom wall 212 into a tube 224. In some embodiments, the tube 224 may comprise an integral portion of the thermalizing conduit 206 that extends into the container 210. The tube 224 may extend through the liquid reagent disposed within the container 210 to the space 222 over the liquid reagent. The tube 224 may comprise a ninety-degree bend, such that an end portion of the tube 224 extends horizontally over the liquid reagent. As shown in FIG. 3, an aperture 226 may be provided through the cylindrical side wall of the tube 224 on a side thereof facing the surface of the liquid reagent, such that gases flowing through the tube 224 will exit the tube 224 through the aperture 226. The gases exiting the aperture 226 may be directed out from the aperture 226 in a direction oriented toward the surface of the liquid reagent to promote reaction between one or more components of the gases and the liquid reagent.

For example, in embodiments in which the source gas comprises $GaCl_3$ and a carrier gas, such as $H_2$, and the source gas has decomposed to include gaseous GaCl and a chlorinated gas species within the thermalizing conduit 206, the liquid reagent within the container 210 may comprise liquid gallium, which may react with the chlorinated gas species (e.g., HCl) generated within the thermalizing conduit 206 to form additional gaseous GaCl. Alternatively, the liquid reagent within the container 210 may comprise liquid indium or liquid aluminum, which may respectively react with the chlorinated gas species (e.g., HCl) to form InCl or AlCl. The gases within the space 222 over the liquid reagent within the container 210 may flow out from the container through an outlet port 228. For example, the outlet port 228 may be located in the top wall 214 of the container 210 over the horizontally extending portion of the tube 224. The outlet port 228 may lead to an outlet conduit 230, an end of which may define the outlet 204 of the gas injector 200 (FIG. 2).

The various components of the container 210 may be at least substantially comprised of a refractory material such as, for example, quartz.

The GaCl may be a desirable precursor gas for forming GaN. Thus, by converting the excess chlorinated gas that results from thermal decomposition of $GaCl_3$ (in systems that employ $GaCl_3$ as a source gas) into additional GaCl, detrimental effects of excess chlorinated gas species to the deposited GaN material may be avoided, since the amount of chlorinated gas species introduced to the workpiece substrate 112 (FIG. 1) may be reduced. Such detrimental effects may include, for example, incorporation of chlorine atoms into the gallium nitride crystal lattice and cracking or delamination of deposited GaN film. In addition, detrimental effects may include, for example, forming excess hydrogen chloride gas (HCl). The hydrogen chloride may act as an etchant to a deposited III-nitride layer within deposition system 100 thereby reducing the growth rate or even preventing deposition of the III-nitride. Furthermore, by reacting the excess chlorinated species with the liquid gallium to form additional GaCl, the efficiency of the deposition system 100 may be improved.

Figure 4:
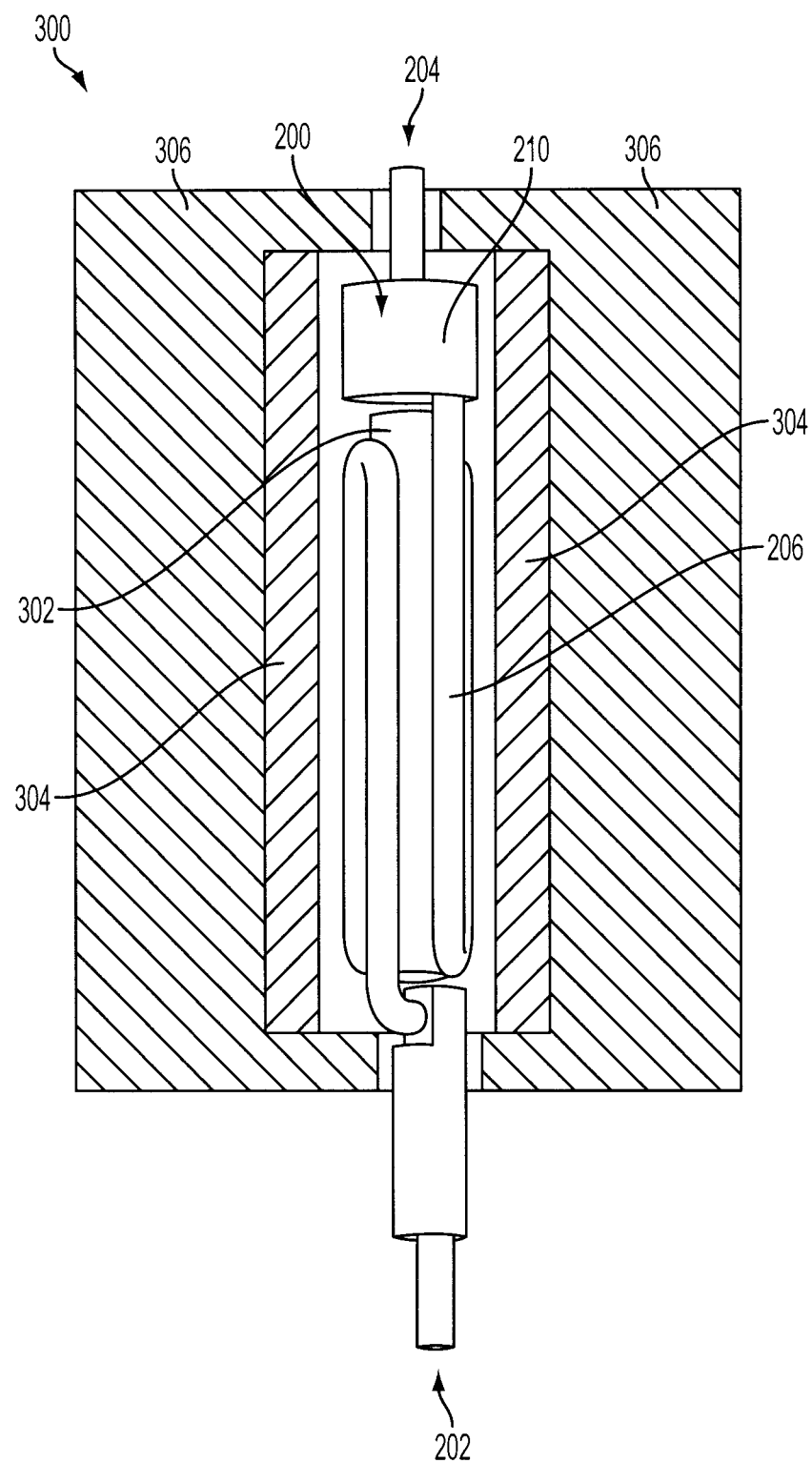
FIG. 4 schematically illustrates another embodiment of a gas injector of the invention that is similar to that of FIG. 2, but further includes active and passive heating elements.

FIG. 4 illustrates another embodiment of a thermalizing gas injector 300 that includes the gas injector 200 of FIG. 2, as well as active and passive heating components for heating at least the thermalizing conduit 206 and the container 210 of the gas injector 200. In other words, at least one heating element may be disposed proximate at least one of the thermalizing conduit 206 and the container 210 to heat at least one of the thermalizing conduit 206 and the container 210 of the gas injector 200.

As shown in FIG. 4, the thermalizing gas injector 300 includes a cylindrical passive heating element 302 that is disposed within a generally cylindrical space that is surrounded by the thermalizing conduit 206 of the gas injector 200.

The passive heating element 302 may be at least substantially comprised of materials with high emissivity values (close to unity) (black body materials) that are also capable of withstanding the high-temperature, corrosive environments that may be encountered within the deposition system 100 (FIG. 1). Such materials may include, for example, aluminum nitride (AlN), silicon carbide (SiC), and boron carbide ($B_4C$), which have emissivity values of 0.98, 0.92, and 0.92, respectively.

The passive heating element 302 may be solid or hollow. In some embodiments, the passive heating element 302 may be hollow, and a thermocouple may be positioned within the interior space of the passive heating element 302 for temperature monitoring and control purposes. In additional embodiments, a cylindrical thermocouple may be positioned around the passive heating element 302 and between the passive heating element 302 and the surrounding thermalizing conduit 206.

In additional embodiments, hollow cylindrical passive heating elements may be disposed over and around one or more straight sections of the thermalizing conduit 206. In such embodiments, a cylindrical thermocouple may be positioned between the hollow cylindrical passive heating elements and the sections of the thermalizing conduit 206 surrounded by the hollow cylindrical passive heating elements.

The thermalizing gas injector 300 also may include an active heating element 304. The active heating element 304 may at least partially surround each of the thermalizing conduit 206 and the container 210 of the gas injector 200. In some embodiments, the active heating element 304 may be generally cylindrical and may extend entirely around at least a portion of each of the thermalizing conduit 206 and the container 210, as shown in FIG. 4. The active heating element 304 may comprise, for example, at least one of a resistive heating element, an inductive heating element, and a radiant heating element. An insulating jacket 306 may at least substantially surround the gas injector 200, the passive heating element 302, and the active heating element 304, as shown in FIG. 4, so as to improve the efficiency of the heating process by which the active heating element 304 and the passive heating element 302 heat the thermalizing conduit 206 (or at least the gas or gases contained therein) and the container 210 (or at least the liquid reagent and gas or gases contained therein).

The active and passive heating elements 304, 302 of the thermalizing gas injector 300 may be capable of heating the thermalizing conduit 206, the container 210 and the source gas to temperatures between about 500° C. and about 1,000° C.

Figure 5:
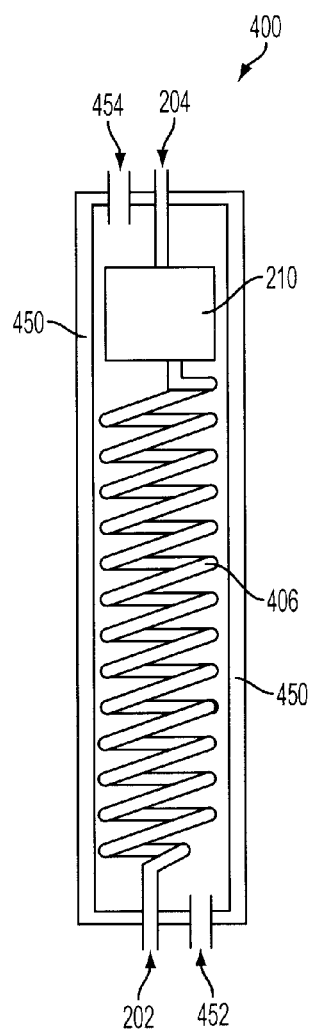
FIG. 5 schematically illustrates another example embodiment of a gas injector of the invention, one or more of which may be used in embodiments of deposition systems of the invention, such as the deposition system of FIG. 1.

FIG. 5 illustrates another embodiment of a gas injector 400 of the invention. The gas injector 400 of FIG. 5 is similar to the gas injector 200 of FIG. 2, and includes an inlet 202, and outlet 204, a thermalizing conduit 406, and a container 210. The container 210 may be as described in relation to FIGS. 2 and 3. The thermalizing conduit 406 is substantially similar to the thermalizing conduit 206 of FIG. 2, except that the thermalizing conduit 406 extends along a spiral path (i.e., has a spiral configuration), instead of having a serpentine configuration, as does the thermalizing conduit 206 of FIG. 2.

As shown in FIG. 5, embodiments of the invention may also include an outer housing 450. The outer housing 450 may be configured to enclose and protect at least the thermalizing conduit 406 and the container 210 of the gas injector 400. The outer housing 450 may also serve as an additional gas-conducting conduit that may be used, for example, to convey purge gases (e.g., purge gases). For example, the outer housing 450 may include an inlet port 452 and an outlet port 454, such that a gas may flow through the outer housing 450 between the inlet port 452 and the outlet port 454. In additional embodiments of the invention, an outer housing 450 may be provided on the gas injector 200 of FIG. 2, the thermalizing gas injector 300 of FIG. 4, or any other gas injector described herein below.

With continued reference to FIG. 5, in operation, a source gas, such as $GaCl_3$ and $H_2$, enters the gas injector 400 through the inlet 202 with an incoming flow rate of less than 100 cubic centimeters per minute (sccm), less than 50 sccm, or even less than 10 sccm. The flow rate, however, may be greater than 20 standard liters per minute (SLM), such as, for example, greater than or equal to 30 SLM. The gaseous precursors, such as GaCl, exit the gas injector 400 through the outlet 204 at temperatures between about 500° C. and about 1,000° C. A purge gas, such as nitrogen gas or a mixture of nitrogen gas and hydrogen gas ($H_2$), enters the outer housing 450 through inlet port 452 with an incoming flow rate of approximately one to five SLM, and maintains an overpressure in at least the interior of the outer housing 450. The purge gas exits the outer housing 450 through the outlet port 454. The purge gas may also be heated as it passes through the outer housing 450.

Figure 6:
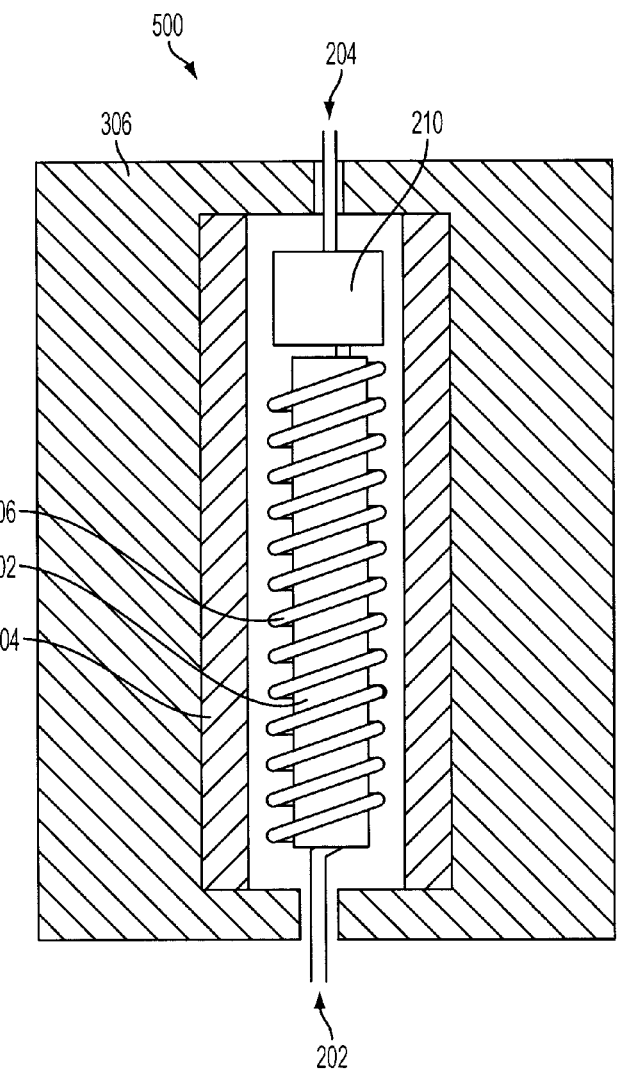
FIG. 6 schematically illustrates another embodiment of a gas injector of the invention that is similar to that of FIG. 5, but further includes active and passive heating elements.

FIG. 6 illustrates another embodiment of a thermalizing gas injector 500 that includes a gas injector substantially similar to the gas injector 400 of FIG. 5, but without the outer housing 450. Thus, the gas injector 500 includes a thermalizing conduit 406 and a container 210, as previously described herein. The gas injector 500 further includes an inlet 202 and an outlet 204. The thermalizing gas injector 500 of FIG. 6 further includes active and passive heating elements like those previously described in relation to the gas injector 300 of FIG. 4. In particular, the gas injector 500 of FIG. 6 includes the previously described cylindrical passive heating element 302, which is disposed within a generally cylindrical space that is surrounded by the spiral-thermalizing conduit 406 of the gas injector 500. The thermalizing gas injector 500 also may include an active heating element 304 and an insulating jacket 306, as previously described in relation to FIG. 4. As previously discussed, the active and passive heating elements of the thermalizing gas injector 500 may be capable of heating the thermalizing conduit 406, the container 210 and the source gas to temperatures between about 500° C. and about 1,000° C.

Figure 7:
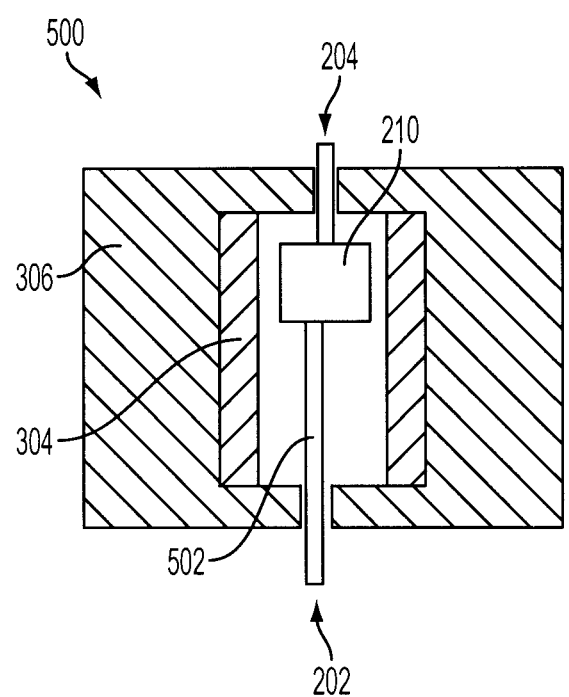
FIG. 7 schematically illustrates another embodiment of a gas injector, one or more of which may be used to inject precursor gases onto substrates in embodiments of deposition systems of the invention, such as the deposition system of FIG. 1.

FIG. 7 illustrates an example of a gas injector 500 that may be used to inject dopant precursors onto the workpiece substrate 112 of FIG. 1. The gas injector 500 includes an inlet 202, an outlet 204, and a container 210 as previously described in relation to FIGS. 2 and 3. A generally straight conduit 502 may extend from the inlet 202 to the container 210 (in place of the thermalizing conduit 206 of FIGS. 2 and 3). The container 210 may be configured to hold a liquid metal reagent therein, such as, for example, liquid aluminum and liquid indium. In some embodiments of the invention the container 210 may be configured to hold one or more solid materials, such as, for example, iron, silicon or magnesium, etc.

The gas injector 500 also may include active and/or passive heating elements, such as, for example, the active heating element 304 and the insulating jacket 306 previously described in relation to the gas injector 300 of FIG. 4. The active and/or passive heating elements may be used to heat the container 210 (or at least the liquid contained therein) to temperatures sufficient to maintain the metal within the container 210 in the liquid state.

A source gas, such as gaseous hydrogen chloride, chlorine or gaseous GaCl may be supplied from an external gas source to the inlet 202. The source gas may flow from the inlet 202 through the conduit 502 to the container 210, where the source gas may react with the metal reagent within the container 210 to form a precursor gas (e.g., InCl, AlCl, FeCl, etc.). The precursor gas may flow out from the container 210 through the outlet 204.

The flow rate of the gases through the gas injector 500 relative to the flow rates of the other gas injectors of the deposition system 100 may be selectively controlled so as to control the concentration of the elements deposited from the dopant precursor in the resulting III-V semiconductor material.

As described above, embodiments of thermalizing gas injectors of the invention may be used to inject gaseous group III element precursors and group V element precursors onto the workpiece substrate 112 for depositing III-V semiconductor materials using an S-ALD process. For example, in some embodiments, the thermalizing gas injectors of the invention may be used to convert $GaCl_3$ into gaseous GaCl by thermal decomposition of $GaCl_3$ in the presence of hydrogen, and by reaction of a chlorinated species (e.g., HCl, $Cl_2$) resulting from such thermal decomposition of $GaCl_3$ with liquid gallium, and to inject GaCl onto the workpiece substrate 112 for the deposition of GaN in an ALD process.

FIGS. 8A through 8D illustrate examples of configurations of conduits 116 and gas injectors 102 that may be used to generate the group III element precursors from source gases supplied externally by the gas sources 114A, 114B, 114C, 114D (FIG. 1), as indicated by directional arrows 107. For example, the group III element precursor may be generated from a gas including one or more group III elements and one or more carrier gases, or by passing a gas, such as hydrogen chloride (HCl) vapor, over a heated group III element (i.e., liquid gallium, liquid aluminum, liquid indium, etc.) to form a group III precursor gas, such as GaCl, AlCl or InCl, as described with respect to FIGS. 3 and 7. By forming the precursor gases as described with respect to FIGS. 8A through 8D, a concentration of the precursor gases may be tailored for forming a III-V semiconductor material having a desired composition. In some embodiments, the conduits 116 may include a plurality of branches 126A, 126B, 126C for carrying different precursors to and from the injectors 102. The branches 126A, 126B, 126C of the conduits 116 may converge forming a single gas stream, as indicated by directional arrows 109, which may be supplied to the gas columns 108 (FIG. 1).

Figure 8A:
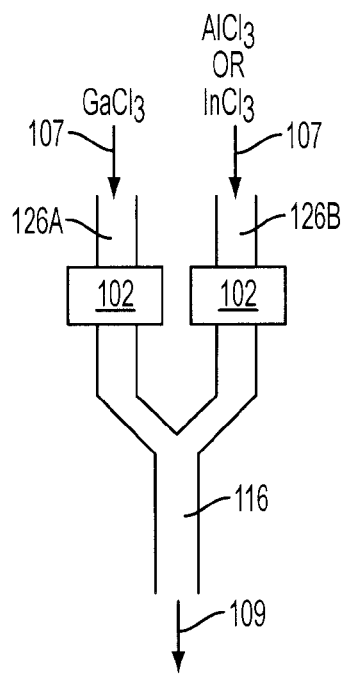
FIGS. 8A through 8D schematically illustrate examples of embodiments of gas mixtures that may be supplied to the at least one gas injector of the manifold.

As shown in FIG. 8A, a precursor mixture including GaCl and at least one of InCl and AlCl may be formed using the injectors 102. For example, $GaCl_3$ may be converted to GaCl and a chlorinated gas in a first branch 126A of conduit 116 and $InCl_3$ or $AlCl_3$ may be respectively converted to InCl or AlCl in a second branch 126B of the conduit 116. In embodiments in which the precursor mixture includes GaCl and InCl, the precursor mixture may be used in forming one or more of InGaN, InGaAs and InGaP on the workpiece substrate 112 (FIG. 1). In embodiments in which the precursor mixture includes GaCl and AlCl, the precursor mixture may be used in forming one or more of AlGaN, AlGaAs, AlGaP on the workpiece substrate 112 (FIG. 1).

Figure 8B:
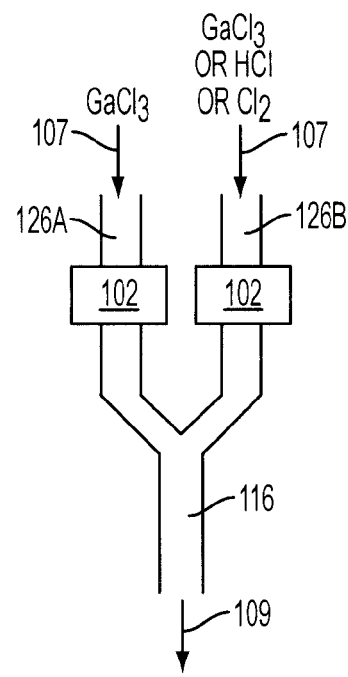
Figure 8C:
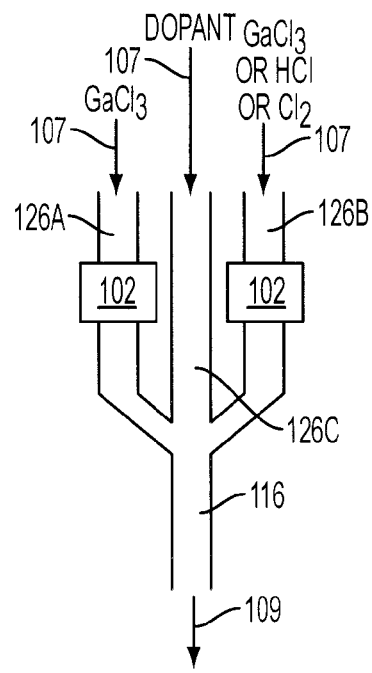

Referring to FIGS. 8B and 8C, two or more group III element precursors, such as two or more of GaCl, AlCl, InCl or FeCl may be formed by passing $GaCl_3$, from an external source, over a heated group III element source (e.g., an indium source or an aluminum source) using a gas injector 102, such as that described with respect to FIGS. 3 and 7. As a non-limiting example, $GaCl_3$ may be passed over a heated indium source to form the InCl and GaCl, over a heated aluminum source to form the AlCl and GaCl, or over a heated iron source to form the FeCl and GaCl. Additional GaCl precursor may be formed by passing at least one of hydrogen chloride and chlorine gas over a gallium source.

In a first branch 126A of the conduit 116, GaCl and at least one of hydrogen chloride and chlorine gas may be generated from one or more of $GaCl_3$ and $H_2$ using an injector 102 such as that described with respect to FIGS. 3 and 7. In a second branch 126B of the conduit 116, additional GaCl or an additional group III element precursor may be generated by the injector 102. In embodiments in which additional GaCl is generated, a chlorinated gas generated from at least one of $GaCl_3$, hydrogen chloride or hydrogen gas may be reacted with gallium to form additional GaCl. In embodiments in which the additional group III element precursor is formed, GaCl, hydrogen chloride or chlorine generated from the $GaCl_3$ may be reacted with at least one of indium, aluminum or iron to form the additional group III element precursor (i.e., InCl, AlCl or FeCl). The first branch 126A and the second branch 126B of the conduit 116 converge, resulting in mixing of the gases.

In some embodiments, additional gases that may be used for doping the III-V semiconductor materials may be added to the conduits 116. As shown in FIG. 8C, $GaCl_3$ supplied to a first branch 126A of conduit 116 may be mixed with a dopant gas supplied to a second branch 126B of the conduit 116. Suitable dopant gases include, but are not limited to, iron-containing gases, dichlorosilane ($H_2SiCl_2$), silane ($SiH_x$) and silicon tetrachloride ($SiCl_2$). Optionally, a third branch 126C of conduit 116 may be used to generate an additional group III element precursor or additional GaCl, as described with respect to FIG. 8B.

Figure 8D:
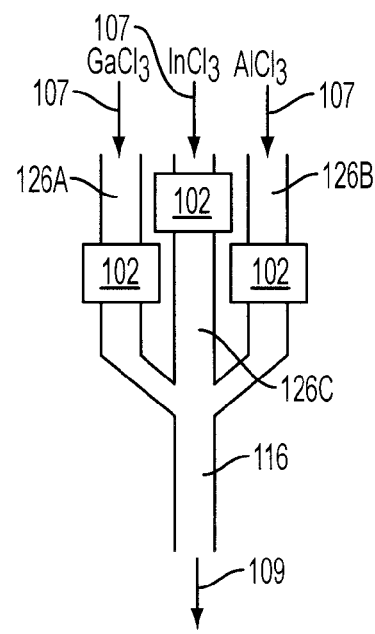

In additional embodiments shown in FIG. 8D, a conduit 116 may include branches 126A, 126B, and 126C and one of $GaCl_3$, $InCl_3$ and $AlCl_3$ may be supplied in at least two of the branches 126A, 126B, 126C to form a gas comprising a mixture of at least two of $GaCl_3$, $InCl_3$ and $AlCl_3$. The combination of at least two of $GaCl_3$, $InCl_3$ and $AlCl_3$ may be used to form ternary group III compounds, such as, for example, InGaN or AlGaN, and quaternary group III compounds, such as, for example, AlInGaN.

The deposition system 100 described with respect to FIG. 1 may be employed in a method of forming the III-V semiconductor material by S-ALD. For example, the method may employ a plurality of ALD growth cycles 122, 124 for forming the III-V semiconductor material, each of the ALD growth cycles including exposing the workpiece substrate 112 to at least one group III precursor and at least one group V precursor. Excess precursor and purge gas may be removed by the gas columns 108 connected to the exhaust line 120 to prevent mixing of the at least one group III precursor and the at least one group V precursor. Each ALD growth cycle 122, 124 may, therefore, form a layer of a specific III-V semiconductor material. Any number of ALD growth cycles may be performed using the deposition system 100 to form a desired thickness of the specific III-V semiconductor material or to form a plurality of layers of different III-V semiconductor materials. The precursors supplied to the workpiece substrate 112 during each of the growth cycles may be tailored to form the desired III-V semiconductor material or the desired plurality of layers of different III-V semiconductor materials on the workpiece substrate 112. For example, the method may be used to form a plurality of layers including III-V semiconductor materials having different compositions useful in device layers, such as those of LEDs.

At least one of the assembly 106 and the manifold 104 is configured to establish movement of the workpiece substrate 112 relative to the manifold 104. The workpiece substrate 112 may be positioned on the assembly 106 and moved relative to the manifold 104 through a series of injection positions along the length of the manifold 104 (i.e., positions underlying each of the longitudinally aligned gas injectors 102A, 102B, 102C, 102D). At each of the injection positions, the workpiece substrate 112 may be exposed to the at least one group III element precursor or the at least one group V element precursor by the overlying gas injector 102A, 102B, 102C, 102D such that a layer of a group III material, a group V material or a group III-V compound material is deposited on the workpiece substrate 112. The gas injectors 102A, 102B, 102C, 102D may be programmed to control the precursor flow rate and composition to form the desired III-V semiconductor material.

The group III element precursor may be formed from a group III element source using embodiments of the thermalizing gas injectors of the invention, which were previously described. In some embodiments, at least one of $GaCl_3$, $InCl_3$ and $AlCl_3$ and one or more carrier gases, such as $H_2$, $N_2$ and Ar, may be thermalized using the gas injectors 102A, 102B, 102C, 102D to form the group III element precursor (i.e., GaCl, InCl and AlCl). In other embodiments, the group III element source including a mixture of gases, such as $GaCl_3$, $InCl_3$ and $AlCl_3$, may be used to form ternary and quaternary III-V semiconductor materials, such as InGaN, InGaAs, InGaP, AlGaN, AlGaAs and AlGaP. For example, the mixture of gases may be formed prior to entry into the gas injectors 102A, 102B, 102C, 102D, as described with respect to FIGS. 8A through 8D. Such mixtures may be used to form ternary and quaternary III-V semiconductor materials on the workpiece substrate 112. For example, a mixture of $GaCl_3$ and $InCl_3$ may be supplied to one or more of the gas injectors 102A, 102B, 102C, 102D for forming InGaN, InGaAs or InGaP on the workpiece substrate 112 or a mixture of $GaCl_3$ and $AlCl_3$ may be supplied to the gas injectors 102A, 102B, 102C, 102D for forming AlGaN, AlGaAs or AlGaP on the workpiece substrate 112. A ratio of the gases in the mixture may be adjusted to form the III-V semiconductor material having a desired composition.

The group V element precursor may be formed by thermalizing a group V element source or by other techniques known in the art (e.g., plasma generation techniques). For example, at least one of ammonia ($NH_3$), arsine ($AsH_3$) and phosphine ($PH_3$) may be thermalized to form the group V element precursor.

In some embodiments of the invention, one or more of the gas injectors 102A, 102B, 102C, 102D may be used to generate a group III element precursor, such as GaCl, InCl or AlCl, and to expose a major surface of the workpiece substrate 112 to the group III element precursor. In additional embodiments of the invention, one or more of the gas injectors 102A, 102B, 102C, 102D may be used to generate different group III element precursors that may be used to form group III nitride compound materials that include two or more different group III elements such as, for example, InGaN, AlGaN, InAlGaN, etc. By way of example and not limitation, first and third gas injectors 102A, 102C may be used to supply one or more of GaCl (by converting $GaCl_3$ into gaseous GaCl by thermal decomposition of $GaCl_3$, and by reaction of chlorinated species resulting from such thermal decomposition of $GaCl_3$ with liquid gallium), InCl (by converting $InCl_3$ into gaseous InCl by thermal decomposition of $InCl_3$, and by reaction of chlorinated species resulting from such thermal decomposition of $InCl_3$ with liquid indium) and AlCl (by converting $AlCl_3$ into gaseous AlCl by thermal decomposition of $AlCl_3$, and by reaction of chlorinated species resulting from such thermal decomposition of $InCl_3$ with liquid indium), and second and fourth gas injectors 102B, 102D may be used to supply gaseous ammonia ($NH_3$), gaseous arsine ($AsH_3$), or gaseous phosphine ($PH_3$). Each gas injector 102A, 102B, 102C, 102D may introduce a sufficient amount of precursor gas to the workpiece substrate 112 to deposit a layer of material on the workpiece substrate 112. The deposition system 100 may include any number of gas injectors 102A, 102B, 102C, 102D for depositing the desired thickness of the III-V semiconductor material or the plurality of layers of different III-V semiconductor materials on the workpiece substrate 112. In addition, the workpiece substrate 112 may be passed through the deposition system 100 any number of times to obtain a desirable thickness of the III-V semiconductor material or the plurality of layers of different III-V semiconductor materials.

In yet additional embodiments of the invention, at least one of the gas injectors 102A, 102B, 102C, 102D may be used to generate a dopant precursor (e.g., iron chloride (FeCl) or a vapor phase species comprising silicon (Si)) that may be used to introduce a dopant (e.g., iron atoms or ions or silicon atoms or ions) to the III-V semiconductor material. During the deposition process, the dopant precursor may decompose and/or react with another substance in such a manner as to result in the dopant being incorporated into the III-V semiconductor material being deposited. In such embodiments, it may not be necessary to thermally decompose the dopant precursor in the gas injector used to inject the dopant precursor.

By way of non-limiting example, each of the ALD growth cycles 122, 124 may be used to form a layer of the III-V semiconductor material having a desired composition or a plurality of layers of III-V semiconductor material, each having a different composition. A first ALD growth cycle 122 may be performed to deposit a first layer of III-V semiconductor material. As the workpiece substrate 112 moves along the length of the manifold 104 through a first ALD growth cycle 122, the workpiece substrate 112 may be positioned under the gas column 108 in communication with the first injector 102A. The first injector 102A may supply the group III element precursor to the workpiece substrate 112 through the corresponding gas column 108 and the group III element may be absorbed on the surface of the workpiece substrate 112.

Excess gases or group III element precursor may be removed from the workpiece substrate 112 by pumping the gases from the surface of the workpiece substrate 112 through the gas columns 108 connected to the exhaust line 120. A purging act may also be performed between pumping acts by exposing the surface of the workpiece substrate 112 to the purge gas.

The workpiece substrate 112 may then be moved relative to the manifold 104 to a position under the second injector 102B. The workpiece substrate 112 may be exposed to the group V element precursor supplied by the second injector 102B. The second injector 102B may introduce a sufficient amount of the group V element precursor to the workpiece substrate 112 that the group V element reacts with the group III element deposited on the surface of the workpiece substrate 112 by the first injector 102A to form the first layer of III-V semiconductor material. Excess gases or group V element precursor may be removed from the workpiece substrate 112 by pumping and purging, as previously described. The ALD growth cycle 122 may be repeated any number of times to increase a thickness of the first layer of III-V semiconductor material.

Another ALD growth cycle 124 may be performed to deposit a second layer of III-V semiconductor material having a composition different from that of the first layer of III-V semiconductor material. As the workpiece substrate 112 is moved relative to the manifold 104 through the second ALD growth cycle 124, the workpiece substrate 112 may be positioned under the third injector 102C. The third injector 102C may introduce the group III element precursor to the workpiece substrate 112 and the group III element may be absorbed on the surface of the workpiece substrate 112.

Excess gases or precursor may be removed from the workpiece substrate 112 by pumping and purging, as previously described.

After removing the excess gases, the workpiece substrate 112 may be moved relative to the manifold 104 to a position under the fourth injector 102D. The fourth injector 102D may introduce the group V element precursor to the workpiece substrate 112 and the group V element may react with the group III element deposited on the surface of the workpiece substrate 112 to form the second layer of III-V semiconductor material. The ALD growth cycle 124 may be repeated any number of times to increase a thickness of the second layer of III-V semiconductor material.

The thickness of the layer of III-V semiconductor material formed in one of the ALD growth cycles 122, 124 may depend on the precursors used and the speed of relative movement of the workpiece substrate 112 along the length of the manifold 104. Any number of ALD growth cycles 122, 124 may be performed to deposit a desired thickness of the III-V semiconductor material or to form layers of the III-V semiconductor materials having different compositions. The types of precursors introduced to the workpiece substrate 112 by the gas injectors 102A, 102B, 102C, 102D may be tailored to form the desired III-V semiconductor material or the desired plurality of layers of III-V semiconductor materials. In embodiments where a structure including a plurality of layers of III-V semiconductor materials is formed, the desired thickness of a specific III-V semiconductor material may be formed on the workpiece substrate 112 by performing one or more first ALD growth cycles 122 and, thereafter, one or more second ALD growth cycles 124 may be performed to form a desired thickness of another, different III-V semiconductor material. The ALD growth cycles 122,124 may be tailored to control the thickness and composition of each layer of III-V semiconductor material deposited using the deposition system 100.

Relative movement of the workpiece substrate 112 and the manifold 104 enables continuous, sequential exposure of the workpiece substrate 112 to different precursors without loading and unloading the workpiece substrate 112 from a reaction chamber between ALD growth cycles, as with conventional CVD systems, temperature ramps, cleaning, pump down, etc. The speed of the relative movement of the workpiece substrate 112 with respect to the manifold 104 may be varied according to a reaction time of the precursors, providing a high growth rate of the III-V semiconductor materials. The thickness and composition of each of the III-V semiconductor materials deposited may be determined by a number of injection positions (i.e., positions under each of the gas columns 108 corresponding to the gas injectors 102A, 102B, 102C, 102D) in the deposition system 100 and the type of precursors introduced to the workpiece substrate 112 at each of these injection positions. Thus, the deposition system 100 enables accurate control of the thickness and the composition of each of the III-V semiconductor materials. The deposition system 100 may be configured to deposit any combination of III-V semiconductor material layers, each having a desired thickness and composition. The deposition system 100, and related methods, further provide substantially increased throughput of III-V semiconductor materials in comparison to conventional deposition systems and methods, thus reducing fabrication costs. The deposition system 100 further enables fabrication of structures including multiple layers of III-V semiconductor materials, such as those used in III-nitride based devices, such as Laser Diode, LEDs, high-frequency and power diodes.

The following example serves to explain an embodiment of the present invention in more detail. This example is not to be construed as being exhaustive or exclusive as to the scope of this invention.

Figure 9:
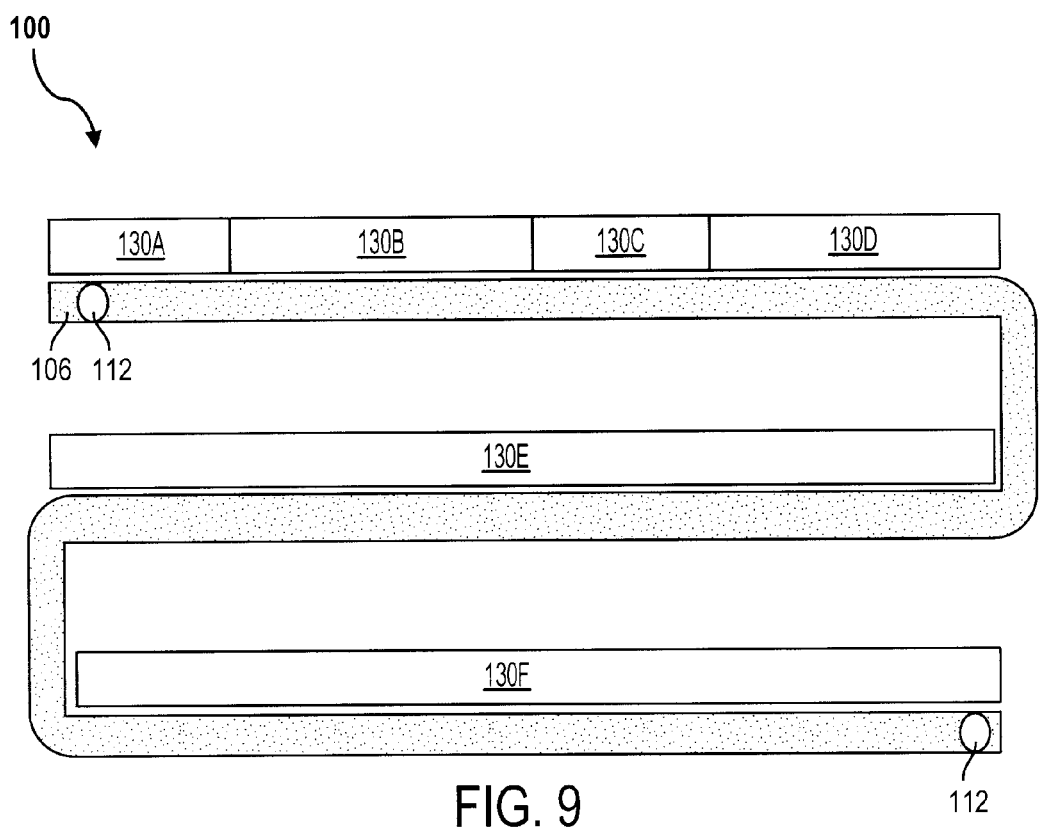
FIG. 9 is a top down view schematically illustrating an example of embodiment of a deposition system and method of the invention.

FIG. 9 is a top-down view of a deposition system 100 like that shown in FIG. 1 and illustrates use of the deposition system 100 in methods of forming structures including multiple layers of different III-V semiconductor materials, in particular, a multi-quantum well LED structure. The deposition system 100 may be used to deposit GaN, InN, AlN and III-nitride alloys. The workpiece substrate 112 may comprise a template structure, such as n-type GaN material on a sapphire substrate. The GaN material has a thickness in a range of from about 1 μm to about 20 μm and may be electrically doped with silicon to produce n-type material. The deposition system 100 may be used to form a plurality of active layers (not shown) upon the GaN layer of the workpiece substrate 112. For example, the active layers may form the basis of a device structure, which may comprise an LED. In additional embodiments, the active layers may be composed and configured to form a laser diode, a transistor, a solar cell, a MEMS, etc.

The deposition system 100 may be maintained at a temperature in a range of from about 350° C. to about 750° C. and a pressure in a range of from about 1000 mTorr to about 7600 mTorr. As a non-limiting example, gas sources may be supplied at a flow rate in a range of from about 1 sccm to about 100 sccm.

In some embodiments, the deposition system 100 may include a plurality of deposition zones 130A, 130B, 130C, 130D, 130E, 130F, each of which is used to form a structure including a plurality of layers on the workpiece substrate 112, each of the layers comprising a III-V semiconductor material having a specific composition. For example, the structure may be an LED device layer structure. In embodiments in which a structure including alternating layers of InGaN and GaN underlying a layer of doped p-type AlGaN and a layer of doped p-type GaN is formed, the deposition system 100 may include first and third deposition zones 130A, 130C for depositing an InGaN material, second and fourth deposition zones 130B, 130D for depositing a GaN material, a fifth deposition zone 130E for depositing a doped p-type AlGaN material and a sixth deposition zone 130F for depositing a doped p-type GaN material. As the workpiece substrate 112 is moved through the zones 130A, 130B, 130C, 130D, 130E, 130F of the deposition system 100, alternating exposures of an appropriate group III precursor and a nitrogen precursor may be introduced to the workpiece substrate 112 to form the desired III-V semiconductor material.

In some embodiments, a thickness of 1 nm of the desired III-V semiconductor material may be deposited every one (1) meter of the manifold 104. In embodiments in which the assembly 106 comprises a track or conveyor used to move the workpiece substrate 112 along a length of the manifold 104, the track may have a length of about 100 meters to move the workpiece substrate 112 under a sufficient number of gas injectors 102A, 102B, 102C, 102D to form a III-V semiconductor material, such as an LED device layer structure, having a thickness of 100 nm. The deposition system 100 may be arranged in a variety of configurations depending on available space. In embodiments where the deposition system has a processing rate of about 1000 wafers per hour, the track may be about 100 square meters (m$^2$) and assuming a deliver rate of device layer structures of 1000 wafer per hour. This corresponds to an area per effective cycle time per wafer of about 0.1 m$^2$ per wafer per hour, which is a substantial improvement over processing rates for conventional CVD reactors.

Additional non-limiting example embodiments of the invention are described below.

Embodiment 1

A method of depositing a semiconductor material, the method comprising: flowing a group III element precursor through a first gas column of a plurality of substantially aligned gas columns; flowing a group V element precursor through a second gas column of the plurality of substantially aligned gas columns; establishing movement of a substrate relative to the plurality of substantially aligned gas columns; and sequentially exposing a surface of the substrate to the group III element precursor and the group V element precursor to form a III-V semiconductor material.

Embodiment 2

The method of embodiment 1, further comprising decomposing a gas comprising at least one group III element to generate the group III element precursor.

Embodiment 3

The method of Embodiment 2, wherein decomposing a gas comprising at least one group III element to generate the group III element precursor comprises decomposing at least one of $GaCl_3$, $InCl_3$, and $AlCl_3$ to form at least one of GaCl, InCl, and AlCl and chlorine.

Embodiment 4

The method of Embodiment 3, wherein decomposing at least one of $GaCl_3$, $InCl_3$, and $AlCl_3$ to form at least one of GaCl, InCl, and AlCl and chlorine comprises decomposing $GaCl_3$ to form GaCl and chlorine.

Embodiment 5

The method of Embodiment 2 or Embodiment 3, further comprising reacting the chlorine with liquid gallium to form additional GaCl.

Embodiment 6

The method of any one of Embodiments 1 through 5, further comprising increasing a thickness of the III-V semiconductor material by repeatedly exposing the surface of the substrate to the group III element precursor and the group V element precursor.

Embodiment 7

The method of any one of Embodiments 1 through 6, further comprising: flowing a purge gas through a third gas column disposed between the first gas column and the second gas column; and exposing the substrate to the purge gas to remove excess group III element precursor and excess group V element precursor from the surface of the substrate.

Embodiment 8

The method of any one of Embodiments 1 through 7, wherein sequentially exposing a surface of the substrate to the group III element precursor and the group V element precursor comprises: exposing the surface of the substrate to at least one of GaCl, InCl, and AlCl to absorb at least one of gallium, indium, and aluminum to the surface of the substrate; and exposing the at least one of gallium, indium, and aluminum absorbed on the surface of the substrate to at least one of nitrogen, arsenic, and phosphorous.

Embodiment 9

The method of any one of Embodiments 1 through 8, wherein sequentially exposing a surface of the substrate to the group III element precursor and the group V element precursor to form a III-V semiconductor material comprises forming at least one of gallium nitride, indium nitride, aluminum nitride, indium gallium nitride, indium gallium arsenide, indium gallium phosphide, aluminum gallium nitride, aluminum gallium arsenide, and aluminum gallium phosphide.

Embodiment 10

The method of any one of Embodiments 1 through 9, wherein sequentially exposing a surface of the substrate to the group III element precursor and the group V element precursor to a III-V semiconductor material comprises forming the III-V semiconductor material having a thickness of about 100 nm.

Embodiment 11

The method of any one of Embodiments 1 through 10, further comprising sequentially exposing a surface of the substrate to another group III element precursor and another group V element precursor to form another III-V semiconductor material over the III-V semiconductor material, the another III-V semiconductor material having a different composition than the III-V semiconductor material.

Embodiment 12

A method of depositing a semiconductor material, comprising: thermally decomposing at least one source gas within a thermalizing gas injector to form a group III element precursor; directing the group III element precursor toward a surface of a substrate through at least one gas column to absorb the at least one group III element on a surface of the substrate; directing a group V element precursor toward the surface of the substrate through at least another gas column substantially aligned with the at least one gas column to form a III-V semiconductor material.

Embodiment 13

The method of Embodiment 12, further comprising establishing movement of the substrate relative to the at least one gas column and the at least another gas column.

Embodiment 14

The method of Embodiment 13, wherein establishing movement of the substrate relative to the at least one gas column and the at least another gas column comprises establishing movement of the substrate relative to the at least one gas column and the at least another gas column of a plurality of gas columns.

Embodiment 15

The method of any one of Embodiments 12 through 14, wherein thermally decomposing at least one source gas within a thermalizing injector to form a group III element precursor comprises thermally decomposing least one of $GaCl_3$, $InCl_3$, and $AlCl_3$ within the thermalizing gas injector to form at least one of GaCl, InCl, and AlCl and chlorine gas.

Embodiment 16

The method of Embodiment 15, further comprising reacting the chlorine gas with at least one of liquid gallium, liquid indium, and liquid aluminum within the thermalizing gas injector to form at least one of additional GaCl, InCl, and AlCl.

Embodiment 17

The method of Embodiment 15 or Embodiment 16, further comprising reacting the GaCl with at least one of liquid indium, liquid aluminum and liquid iron within the thermalizing gas injector to form at least one of $InGaCl_x$, $AlGaCl_x$, and $FeGaCl_x$.

Embodiment 18

The method of any one of Embodiments 12 through 17, wherein directing the group III element precursor toward a surface of a substrate through at least one gas column to absorb the at least one group III element on a surface of the substrate comprises directing at least one of GaCl, InCl, and AlCl toward a surface of a substrate through the at least one gas column to absorb at least one of gallium, indium, and aluminum on the surface of the substrate.

Embodiment 19

The method of Embodiment 18, wherein directing at least one of GaCl, InCl, and AlCl toward a surface of a substrate comprises exposing the substrate to GaCl.

Embodiment 20

The method of any one of Embodiments 12 through 19, wherein directing a group V element precursor toward the surface of the substrate through at least another gas column comprises directing at least one of nitrogen, arsenic, and phosphorous toward the surface of the substrate through the at least another gas column.

Embodiment 21

The method of any one of Embodiments 12 through 20, further comprising thermalizing at least one of ammonia, arsine, and phosphine to generate the group V element precursor.

Embodiment 22

The method of any one of Embodiments 12 through 21, further comprising exposing the surface of the substrate to at least one purge gas to remove at least one of the group III element precursor and the group V element precursor from the surface of the substrate.

Embodiment 23

A deposition system, comprising: a manifold comprising a plurality of substantially aligned gas columns configured to direct one or more gases, at least one of the substantially aligned gas columns configured to receive a group III precursor gas from a thermalizing gas injector comprising: an inlet; a thermalizing conduit; a liquid container configured to hold a liquid reagent therein; an outlet; and a pathway extending from the inlet, through the thermalizing conduit to an interior space within the liquid container, and from the interior space within the liquid container to the outlet; and at least one assembly for moving a substrate relative to the manifold.

Embodiment 24

The deposition system of Embodiment 23, wherein the thermalizing conduit has a length greater than a shortest distance between the inlet and the liquid container.

Embodiment 25

The deposition system of Embodiment 23 or Embodiment 24, further comprising at least one liquid group III element within the liquid container.

Embodiment 26

The deposition system of Embodiment 25, wherein the at least one liquid group III element comprises at least one of liquid gallium, liquid indium, and liquid aluminum.

Embodiment 27

The deposition system of any one of Embodiments 23 through 26, wherein at least one of the thermalizing conduit and the liquid container is at least substantially comprised of quartz.

Embodiment 28

The deposition system of any one of Embodiments 23 through 27, further comprising at least one heating element disposed proximate at least one of the thermalizing conduit and the liquid container.

Embodiment 29

The deposition system of any one of Embodiments 23 through 27, wherein the at least one heating element comprises a passive heating element at least substantially comprised of at least one of aluminum nitride, silicon carbide, and boron carbide.

Embodiment 30

The deposition system of any one of Embodiments 23 through 27, further comprising: at least one gas source; and at least one gas inflow conduit configured to carry a source gas from the gas source to the inlet of the thermalizing gas injector.

Embodiment 31

The deposition system of Embodiment 30, wherein the at least one gas source comprises a source of at least one of $GaCl_3$, $InCl_3$, and $AlCl_3$.

Embodiment 32

The deposition system of any one of Embodiments 23 through 31, further comprising at least one purge gas nozzle disposed between each of the gas columns of the plurality.

Embodiment 33

The deposition system of any one of Embodiments 23 through 32, wherein another gas column adjacent the at least one gas column is configured to receive at least one purge gas.

Embodiment 34

The deposition system of any one of Embodiments 23 through 33, wherein the at least one assembly for moving a substrate relative to the manifold comprises a track system configured to transport the substrate through a series of injection positions along the length of the manifold, each injection position underlying one of the plurality of gas columns.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims.

What is claimed is:

1. A method of depositing a semiconductor material, comprising:
   sequentially exposing a surface of a substrate to a group III element precursor and a group V element precursor in at least one atomic layer deposition (ALD) growth cycle and forming a first III-nitride semiconductor material over the surface of the substrate; and
   exposing a surface of the first III-nitride semiconductor material to one or more metal halide precursors and a group V element precursor and forming a gallium nitride semiconductor material over the first III-nitride semiconductor material.

2. The method of claim 1, wherein forming the first III-nitride semiconductor material over the surface of the substrate comprises forming aluminum nitride over the surface of the substrate.

3. The method of claim 2, wherein forming aluminum nitride over the surface of the substrate comprises forming a layer of aluminum nitride directly on the surface of the substrate.

4. The method of claim 3, further comprising selecting the substrate to comprise a sapphire substrate.

5. The method of claim 4, wherein forming the gallium nitride semiconductor material over the first III-nitride semiconductor material comprises forming at least one of GaN, InGaN, AlGaN, and InAlGaN over the first III-nitride semiconductor material.

6. The method of claim 5, wherein forming the gallium nitride semiconductor material over the first III-nitride semiconductor material comprises forming a layer of GaN directly on the layer of aluminum nitride.

7. The method of claim 6, wherein forming the layer of GaN further comprises thermally decomposing a source gas comprising $GaCl_3$ to form a metal halide precursor comprising GaCl.

8. The method of claim 5, wherein forming at least one of GaN, InGaN, AlGaN, and InAlGaN further comprises thermally decomposing one or more source gases selected from the group consisting of $GaCl_3$, $InCl_3$, and $AlCl_3$ and forming one or more metal halide precursors selected from the group consisting of GaCl, InCl, and AlCl.

9. The method of claim 4, further comprising forming the one or more metal halide precursors by thermally decomposing one or more source gases, the one or more source gases selected from the group consisting of $GaCl_3$, $InCl_3$, and $AlCl_3$.

10. The method of claim 1, further comprising forming at least a portion of the one or more metal halide precursors by reacting a chlorinated species with liquid gallium.

11. The method of claim 10, wherein the one or more metal halide precursors comprises GaCl.

12. The method of claim 10, wherein the chlorinated species comprises one or more of hydrogen chloride and chlorine.

13. The method of claim 1, further comprising forming the one or more metal halide precursors by decomposing at least one of $GaCl_3$, $InCl_3$, and $AlCl_3$ and forming at least one of GaCl, InCl, and AlCl.

14. The method of claim 1, further comprising exposing the substrate to a purge gas to remove at least one of excess group III element precursor and excess group V element precursor from the surface of the substrate.

15. The method of claim 1, further comprising doping the gallium nitride semiconductor material by mixing a dopant gas with the one or more metal halide precursors.

16. The method of claim 1, further comprising forming one or more active layers on or over the gallium nitride semiconductor material.

17. The method of claim 1, further comprising forming one or more device structures on or over the gallium nitride semiconductor material.

18. The method of claim 17, wherein the one or more device structures comprises one or more light-emitting diodes.

* * * * *